US011145554B2

(12) United States Patent
Koh et al.

(10) Patent No.: US 11,145,554 B2
(45) Date of Patent: Oct. 12, 2021

(54) METHOD FOR SOURCE/DRAIN CONTACT FORMATION IN SEMICONDUCTOR DEVICES

(71) Applicant: Taiwan Semiconductor Manufacturing Co., Ltd., Hsinchu (TW)

(72) Inventors: Shao-Ming Koh, Hsinchu (TW); Chen-Ming Lee, Taoyuan County (TW); I-Wen Wu, Hsinchu (TW); Fu-Kai Yang, Hsinchu (TW); Jia-Heng Wang, Hsinchu (TW); Mei-Yun Wang, Hsin-Chu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 113 days.

(21) Appl. No.: 16/688,107

(22) Filed: Nov. 19, 2019

(65) Prior Publication Data

US 2020/0083118 A1 Mar. 12, 2020

Related U.S. Application Data

(62) Division of application No. 15/686,698, filed on Aug. 25, 2017, now Pat. No. 10,490,459.

(51) Int. Cl.

*H01L 21/8238* (2006.01)
*H01L 29/78* (2006.01)
(Continued)

(52) U.S. Cl.

CPC ................ *H01L 21/823871* (2013.01); *H01L 21/02063* (2013.01); *H01L 21/324* (2013.01);
(Continued)

(58) Field of Classification Search

CPC ....... H01L 21/823871; H01L 21/02063; H01L 21/324; H01L 21/76805; H01L 21/76814;
(Continued)

(56) References Cited

U.S. PATENT DOCUMENTS 5,460,993 A 10/1995 Hsu et al.
9,614,086 B1 4/2017 Yeo et al.
(Continued)

FOREIGN PATENT DOCUMENTS

CN 101217145 A 7/2008
CN 101416297 A 4/2009
(Continued)

*Primary Examiner* — Jami Valentine Miller
(74) *Attorney, Agent, or Firm* — Haynes and Boone, LLP

(57) ABSTRACT

A semiconductor device includes an n-type FET device and a p-type FET device. The n-type FET device includes a first substrate region, a first gate stack, a first gate spacer over sidewalls of the first gate stack, and an n-type epitaxial feature in a source/drain (S/D) region of the n-type FET device. The p-type FET device includes a second substrate region, a second gate stack, a second gate spacer over sidewalls of the second gate stack, and a p-type epitaxial feature in an S/D region of the p-type FET device. A vertical distance between a bottom surface of the first gate spacer and a lowest point of an upper surface of the n-type epitaxial feature is greater than a vertical distance between a bottom surface of the second gate spacer and a lowest point of an upper surface of the p-type epitaxial feature.

20 Claims, 12 Drawing Sheets

(51) Int. Cl.

| | |
|---|---|
| ***H01L 27/06*** | (2006.01) |
| ***H01L 21/02*** | (2006.01) |
| ***H01L 21/324*** | (2006.01) |
| ***H01L 21/768*** | (2006.01) |
| ***H01L 23/535*** | (2006.01) |
| ***H01L 27/092*** | (2006.01) |
| ***H01L 29/08*** | (2006.01) |
| ***H01L 29/16*** | (2006.01) |
| ***H01L 29/161*** | (2006.01) |
| ***H01L 29/167*** | (2006.01) |
| ***H01L 29/45*** | (2006.01) |
| *H01L 29/165* | (2006.01) |
| *H01L 29/66* | (2006.01) |
| *H01L 21/306* | (2006.01) |
| *H01L 21/3065* | (2006.01) |

(52) U.S. Cl.

CPC .. *H01L 21/76805* (2013.01); *H01L 21/76814* (2013.01); *H01L 21/76831* (2013.01); *H01L 21/76889* (2013.01); *H01L 21/76895* (2013.01); *H01L 21/823814* (2013.01); *H01L 21/823821* (2013.01); *H01L 23/535* (2013.01); *H01L 27/0605* (2013.01); *H01L 27/0924* (2013.01); *H01L 29/0847* (2013.01); *H01L 29/16* (2013.01); *H01L 29/161* (2013.01); *H01L 29/167* (2013.01); *H01L 29/1608* (2013.01); *H01L 29/45* (2013.01); *H01L 29/7845* (2013.01); *H01L 29/7848* (2013.01); *H01L 21/3065* (2013.01); *H01L 21/30604* (2013.01); *H01L 21/823807* (2013.01); *H01L 29/165* (2013.01); *H01L 29/665* (2013.01); *H01L 29/66545* (2013.01); *H01L 29/7843* (2013.01)

(58) Field of Classification Search

CPC ......... H01L 21/76831; H01L 21/76889; H01L 21/76895; H01L 21/823814; H01L 21/823821; H01L 23/535; H01L 27/0605; H01L 27/0924; H01L 29/0847; H01L 29/16; H01L 29/1608; H01L 29/161; H01L 29/167; H01L 29/45; H01L 29/7845; H01L 29/7848; H01L 21/823807; H01L 29/665

USPC .......................................................... 257/369

See application file for complete search history.

(56) References Cited

U.S. PATENT DOCUMENTS

| | | | | |
|---|---|---|---|---|
| 9,633,999 | B1 | 4/2017 | Lu et al. | |
| 2009/0014794 | A1* | 1/2009 | Zhu | H01L 29/78696 257/344 |
| 2009/0302395 | A1 | 12/2009 | Ohta | |
| 2012/0146154 | A1 | 6/2012 | Itou et al. | |
| 2016/0087053 | A1 | 3/2016 | Kim et al. | |
| 2016/0099342 | A1 | 4/2016 | Basker et al. | |
| 2016/0118303 | A1* | 4/2016 | Kuo | H01L 21/76829 257/368 |
| 2017/0018464 | A1 | 1/2017 | Kim et al. | |
| 2017/0053804 | A1 | 2/2017 | Lu et al. | |
| 2017/0117411 | A1 | 4/2017 | Kim et al. | |
| 2017/0141112 | A1* | 5/2017 | Ching | H01L 21/823807 |
| 2017/0186748 | A1 | 6/2017 | Lee et al. | |
| 2017/0221894 | A1* | 8/2017 | Liu | H01L 29/665 |
| 2017/0243868 | A1* | 8/2017 | Lee | H01L 21/30604 |
| 2017/0278743 | A1* | 9/2017 | Tsai | H01L 21/76814 |
| 2018/0366375 | A1* | 12/2018 | Chen | H01L 27/092 |
| 2019/0067130 | A1 | 2/2019 | Koh et al. | |

FOREIGN PATENT DOCUMENTS

| | | | |
|---|---|---|---|
| CN | 101431101 | A | 5/2009 |
| CN | 102044496 | A | 5/2011 |
| CN | 102315171 | A | 1/2012 |
| CN | 102456627 | A | 5/2012 |
| CN | 104425285 | A | 3/2015 |
| CN | 106206437 | A | 12/2016 |
| KR | 20160112778 | A | 9/2016 |
| KR | 20160112778 | | 9/2019 |
| TW | 201628087 | | 8/2016 |

* cited by examiner

METHOD FOR SOURCE/DRAIN CONTACT FORMATION IN SEMICONDUCTOR DEVICES

PRIORITY

This is a divisional of U.S. application Ser. No. 15/686,698, filed Aug. 25, 2017, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, when forming source/drain (S/D) contacts for small-scaled transistors, such as field effect transistors (FET) having fin-like channel (so-called "FinFETs"), it is sometimes desired to dope S/D features with additional dopants to increase the performance of the devices. Since n-type and p-type FETs may require different dopants, a doping mask is therefore created to mask either the p-type devices or the n-type devices for the doping process. However, patterning and removing this doping mask has become a challenge for the increasingly smaller devices. For example, when creating this doping mask for p-type devices, some over-etching may be required to ensure that there is no mask residue on the p-type S/D features. Such over-etching often leads to reduced mask area for the n-type devices. Consequently, doping the p-type S/D features may inadvertently introduce p-type dopants to the n-type devices.

Some improvements in the S/D contact formation are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
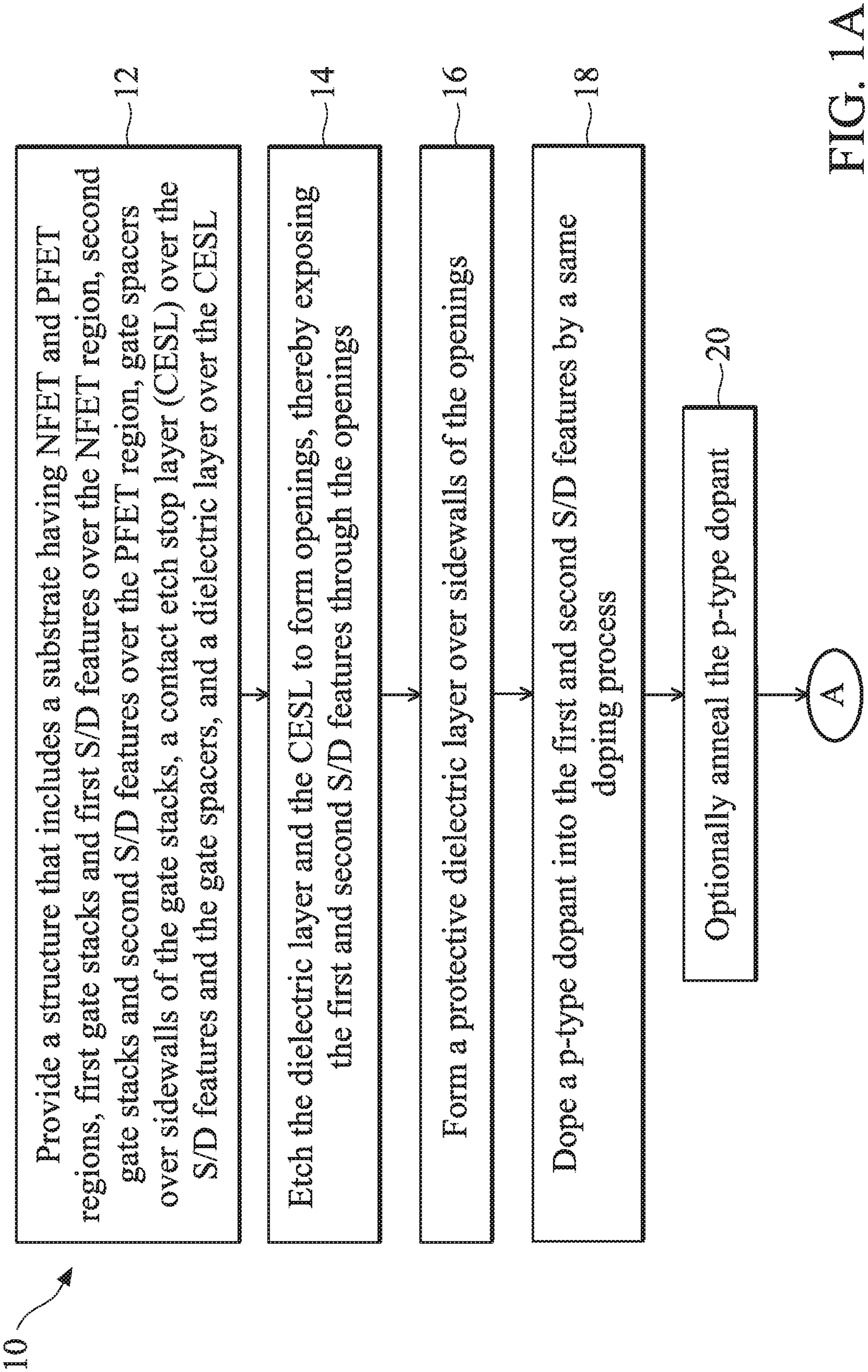
FIGS. 1A and 1B are a flow chart of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to forming S/D contacts in semiconductor devices, particularly for FinFETs. One object of the present disclosure is to reduce the number of mask patterning steps for the S/D contact formation. More particularly, an embodiment of the present disclosure dopes p-type S/D features without masking the n-type S/D features, and then removes counter-doped portions of the n-type S/D features by a selective etching process. In this doping and etching processes, no mask patterning is involved, thereby preventing the issues associated with conventional approaches and saving manufacturing costs at the same time.

Figure 1B:
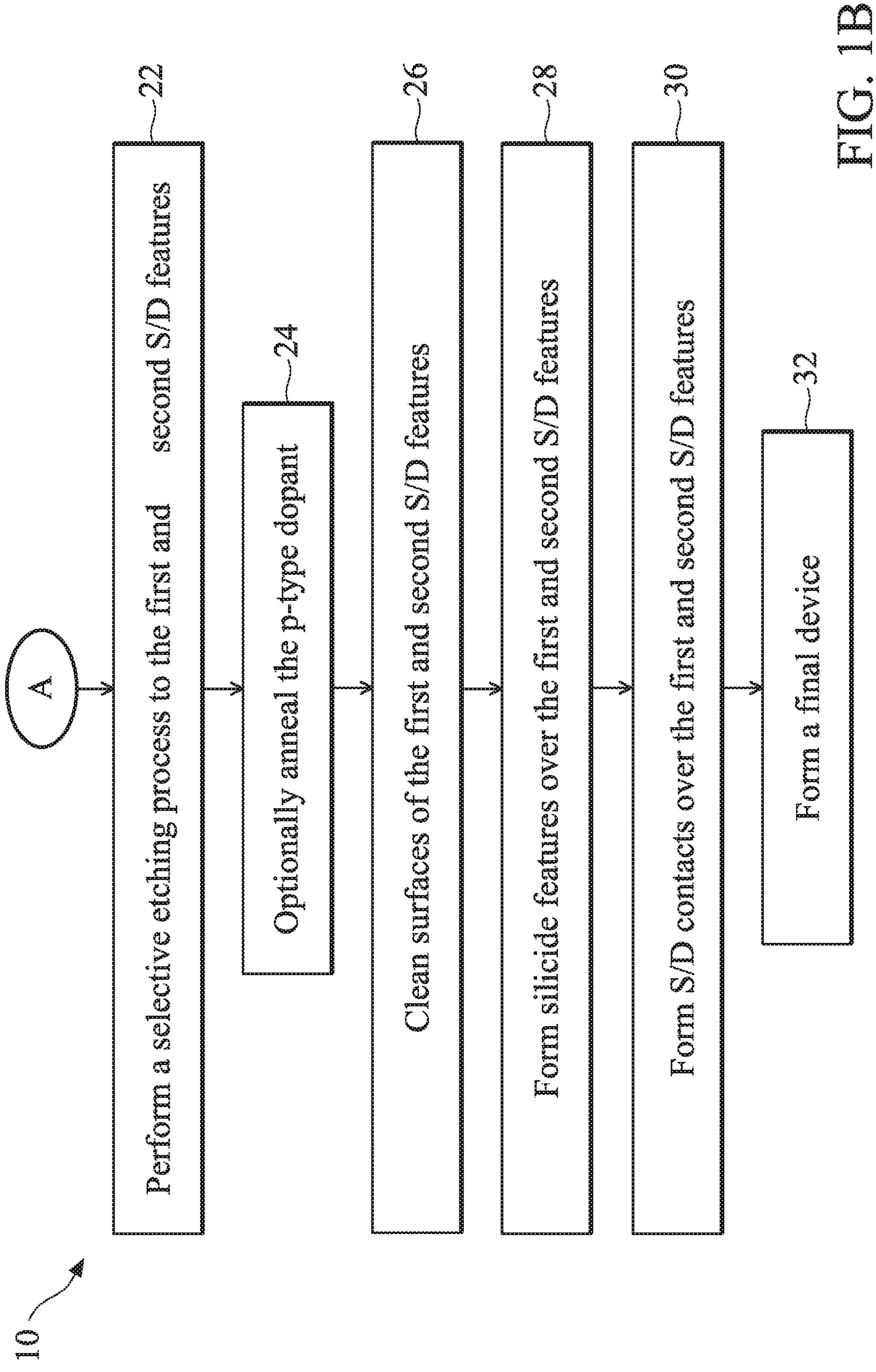

FIGS. 1A and 1B show a flow chart of a method 10 of forming a semiconductor device 100, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2A-11B which are cross-sectional views of the semiconductor device 100 in various stages of a manufacturing process. Particularly, FIGS. 2A, 3A, 4A, 5A, 6A, 7A, 8A, 9A, 10A, and 11A are cross-sectional views of a portion of the device 100 along a fin length direction; and FIGS. 2B, 3B, 4B, 5B, 6B, 7B, 8B, 9B, 10B, and 11B are cross-sectional views of the portion of the device 100 along a fin width direction.

The semiconductor device 100 is provided for illustration purposes and does not necessarily limit the embodiments of the present disclosure to any number of devices, any number of regions, or any configuration of structures or regions. Furthermore, the semiconductor device 100 as shown in FIGS. 2A-11B may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2A:
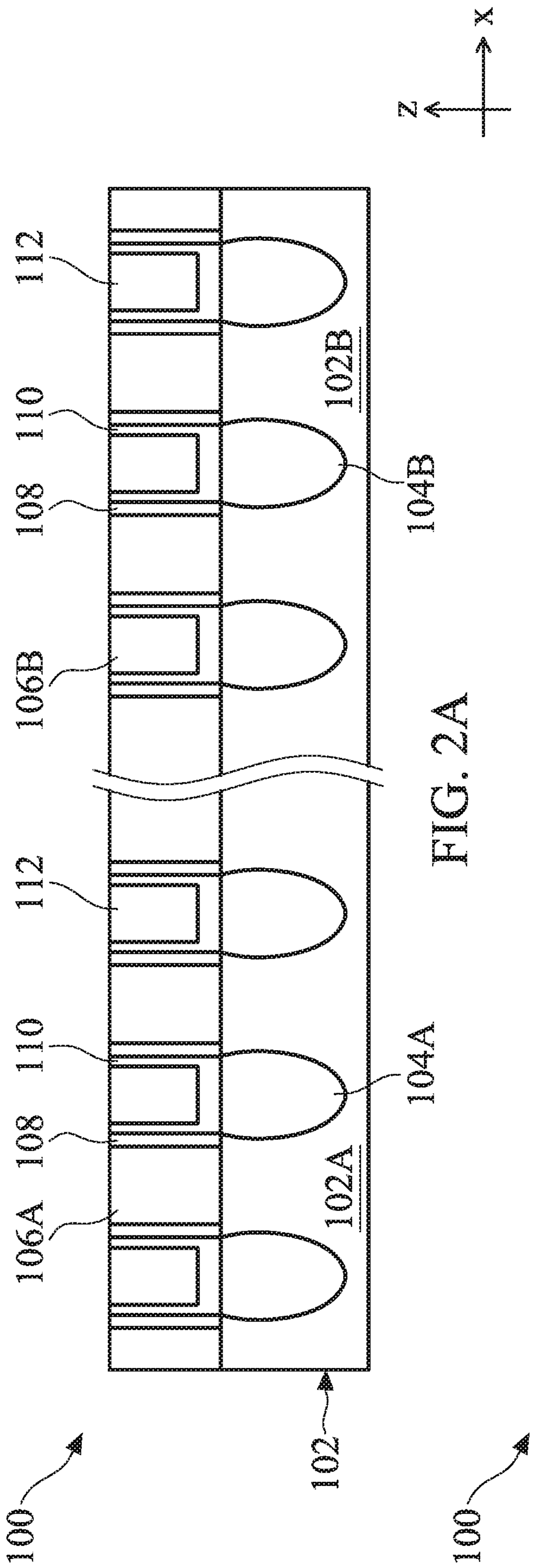
FIGS. 2A, 3A, 4A, 5A, 6A, 7A, 8A, 9A, 10A, and 11A are cross-sectional views (along a fin length direction) of a portion of a semiconductor device during various manufacturing stages according to the method in FIGS. 1A and 1B, in accordance with an embodiment.
Figure 2B:
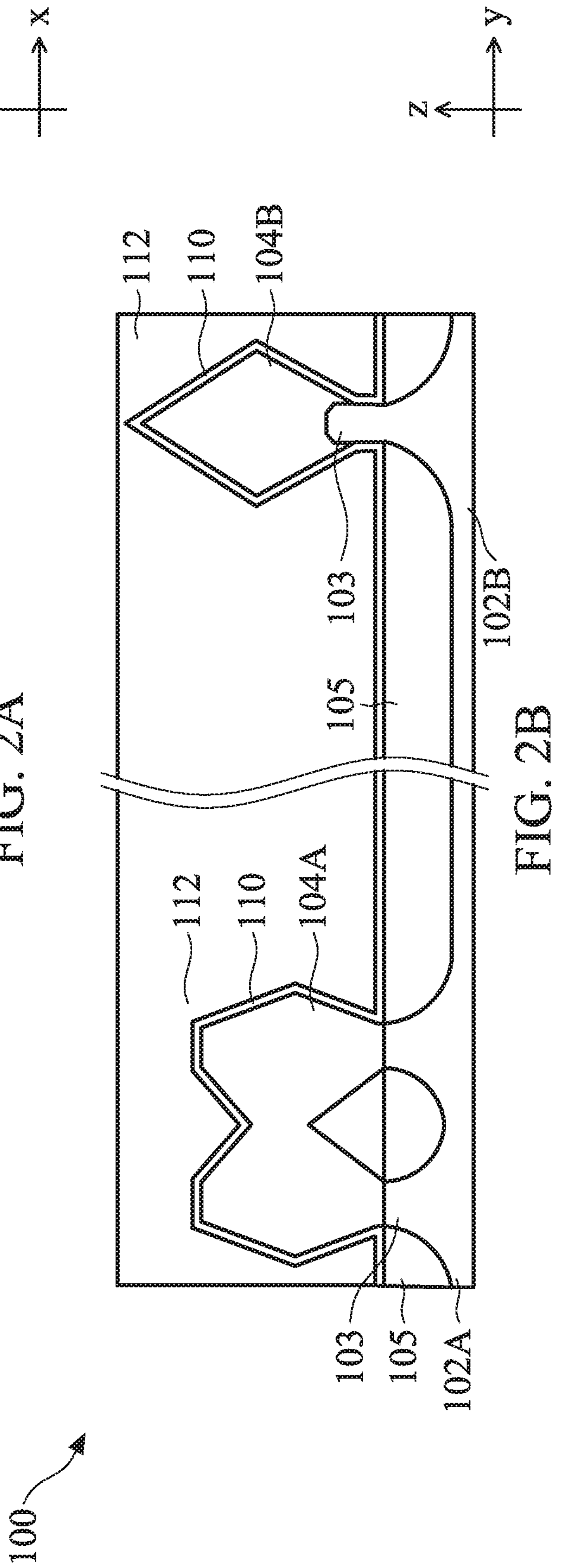
FIGS. 2B, 3B, 4B, 5B, 6B, 7B, 8B, 9B, 10B, and 11B are cross-sectional views (along a fin width direction) of a portion of a semiconductor device during various manufacturing stages according to the method in FIGS. 1A and 1B, in accordance with an embodiment.

Referring to FIG. 1A, at operation 12, the method 10 provides a precursor structure of the device 100 as shown in FIGS. 2A and 2B. Referring to FIGS. 2A and 2B, the device 100 includes a substrate 102 and various features formed therein or thereon. The substrate 102 includes two substrate regions 102A and 102B. In the present embodiment, the substrate region 102A is for forming one or more n-type FinFET devices, and the substrate region 102B is for forming one or more p-type FinFET devices. Therefore, the substrate region 102A is also referred to as the NFET region 102A, and the substrate region 102B is also referred to as the PFET region 102B. The NFET region 102A and PFET region 102B each include one or more semiconductor fins 103 separated by an isolation structure 105 (FIG. 2B). Particularly, FIG. 2A illustrates the device 100 in a cross-sectional view along the length of the fins 103 (the “x” direction), and FIG. 2B illustrates the device 100 in a cross-sectional view along the width of the fins 103 (the “y” direction) in S/D regions of the device 100. In the NFET region 102A, the device 100 further includes S/D features 104A over the fins 103, and gate stacks 106A adjacent to channel regions of the fins 103 and sandwiched by adjacent S/D features 104A. In the PFET region 102B, the device 100 further includes S/D features 104B over the fins 103, and gate stacks 106B adjacent to channel regions of the fins 103 and sandwiched by adjacent S/D features 104B. The device 100 further includes a gate spacer 108 on sidewalls of the gate stacks 106A and 106B, a contact etch stop layer (CESL) 110 over the gate spacer 108 and the S/D features 104A and 104B, and a dielectric layer 112 over the CESL 110 and filling in the gaps between adjacent gate spacers 108. The various features (or components) of the device 100 are further described below.

The substrate 102 is a silicon substrate in the present embodiment. In alternative embodiments, the substrate 102 includes other elementary semiconductors such as germanium; a compound semiconductor such as silicon carbide, gallium arsenide, indium arsenide, and indium phosphide; or an alloy semiconductor, such as silicon germanium carbide, gallium arsenic phosphide, and gallium indium phosphide. In embodiments, the substrate 102 may include silicon on insulator (SOI) substrate, be strained and/or stressed for performance enhancement, include epitaxial regions, doped regions, and/or include other suitable features and layers.

The fins 103 may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into the substrate 102, leaving the fins 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 103 may be suitable.

The S/D features 104A and 104B may include epitaxial semiconductor materials, for example, for applying proper stress and enhancing performance of the device 100. For example, the S/D features 104A may include epitaxially grown silicon or silicon-carbon, and the S/D features 104B may include epitaxially grown silicon germanium. Further, the S/D features 104A and 104B may be doped with proper dopants suitable for the respective n-type and p-type devices. For example, the S/D features 104A may be doped with an n-type dopant such as phosphorus or arsenic, and the S/D features 104B may be doped with a p-type dopant such as boron or indium. In an embodiment, the S/D features 104A and 104B are formed (separately) by etching the fins 103, epitaxially growing a proper semiconductor material over the fins 103, and doping (in-situ or ex-situ) appropriate dopants into the epitaxially grown material. Adjacent S/D features 104A may be separated from each other (not shown) or may merge (e.g., the two 104A in FIG. 2B) in some embodiments. Similarly, adjacent S/D features 104B may be separated from each other (e.g., FIG. 2B) or may merge (not shown) in some embodiments. Furthermore, each of the S/D features 104A and 104B may be of a multi-facet shape.

The isolation structure 105 may include silicon oxide, silicon nitride, silicon oxynitride, fluoride-doped silicate glass (FSG), a low-k dielectric material, and/or other suitable insulating material. In an embodiment, the isolation structure 105 is formed by etching trenches in the substrate 102 (e.g., as part of the process of forming the fins 103), filling the trenches with an insulating material, and performing a chemical mechanical planarization (CMP) process to the substrate 102 including the insulating material. Other types of isolation structure may also be suitable, such as field oxide and LOCal Oxidation of Silicon (LOCOS).

Each of the gate stacks 106A and 106B is a multi-layer structure. For example, each of the gate stacks 106A and 106B may include a dielectric interfacial layer, a gate dielectric layer over the dielectric interfacial layer, and a gate electrode layer over the gate dielectric layer. In an embodiment, the gate stacks 106A and 106B are placeholders (so-called “dummy gates”) for high-k metal gates, wherein one or more of the layers in the gate stacks 106A and 106B are replaced in a later process. In another embodiment, the gate stacks 106A and 106B include a high-k gate dielectric layer, a work function layer over the high-k gate dielectric layer, and a metal layer over the work function layer. In various embodiments, the dielectric interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The gate dielectric layer may include silicon oxide ($SiO_2$). The high-k gate dielectric layer may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The gate electrode layer may include polysilicon or a metal such as aluminum (Al), tungsten (W), cobalt (Co), copper (Cu), and/or other suitable materials. The work function layer may be p-type (for gate stacks 106B) or n-type (for gate stacks 106A). The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), or combinations thereof. The p-type or n-type work function layer may include a plurality of layers and may be deposited by CVD, PVD, and/or other suitable process.

The gate spacer 108 may be a single layer or multi-layer structure. In some embodiments, the gate spacer 108 includes a dielectric material, such as silicon oxide ($SiO_2$), silicon nitride (SiN), silicon oxynitride (SiON), other dielectric material, or combination thereof. In an example, the gate spacer 108 is formed by blanket depositing a first dielectric layer (e.g., a $SiO_2$ layer having a uniform thickness) as a liner layer over the device 100 having the gate stacks 106A and 106B, and a second dielectric layer (e.g., a SiN layer) as a main D-shaped spacer over the first dielectric layer, and then, anisotropically etching to remove portions of the dielectric layers to form the gate spacer 108.

The CESL 110 may include silicon nitride, silicon oxynitride, silicon nitride with oxygen (O) or carbon (C) elements, and/or other materials. In one example, the CESL 110 includes silicon nitride ($Si_3N_4$) having an intrinsic stress with a magnitude of 1 GPa or higher. The intrinsic stress is compressive for p-channel devices and tensile for n-channel devices. The CESL 110 may be formed by PECVD process and/or other suitable deposition or oxidation processes. The CESL 110 covers the outer surfaces of the S/D features 104A and 104B, the sidewalls of the gate spacer 108, and the top surface of the isolation structure 105.

The dielectric layer (or interlayer dielectric) 112 may include materials such as tetraethylorthosilicate (TEOS) oxide, un-doped silicate glass, or doped silicon oxide such as borophosphosilicate glass (BPSG), fluoride-doped silicate glass (FSG), phosphosilicate glass (PSG), boron doped silicon glass (BSG), and/or other suitable dielectric materials. The dielectric layer 112 may be deposited by a PECVD process, a flowable CVD (FCVD) process, or other suitable deposition technique. In an embodiment, the CESL 110 is deposited as a blanket layer over the substrate 102 covering various structures thereon, and the dielectric layer 112 is deposited over the CESL layer 110 to fill trenches between the gate stacks 106A and 106B.

Figure 3A:
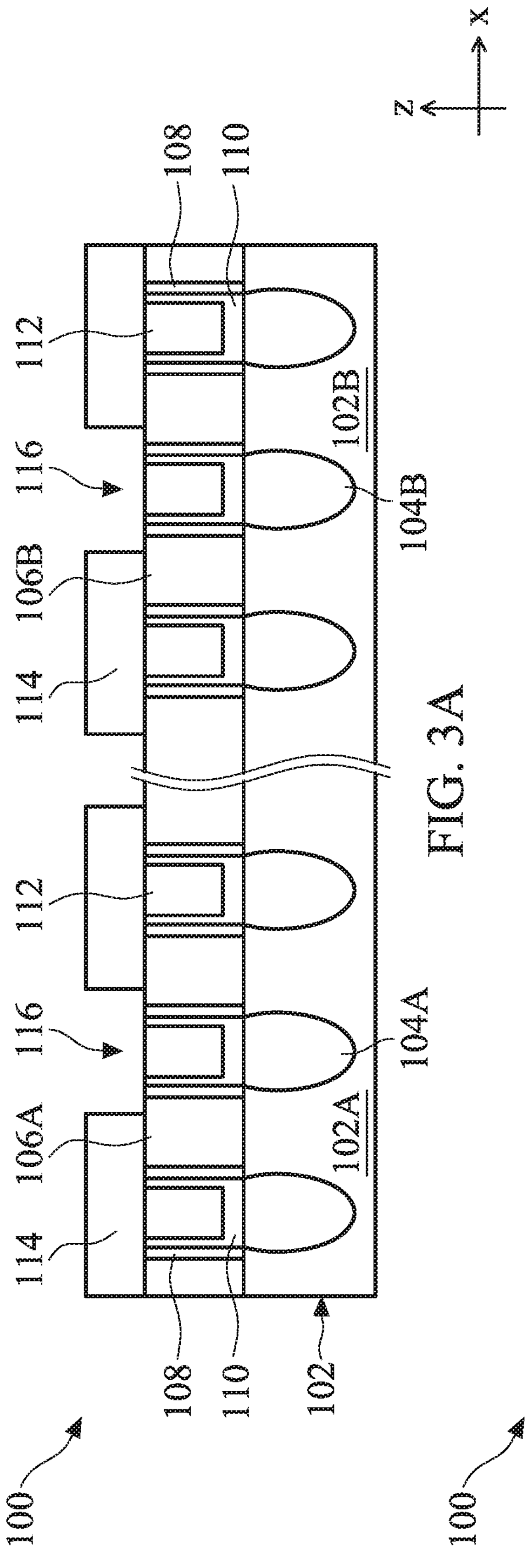
Figure 3B:
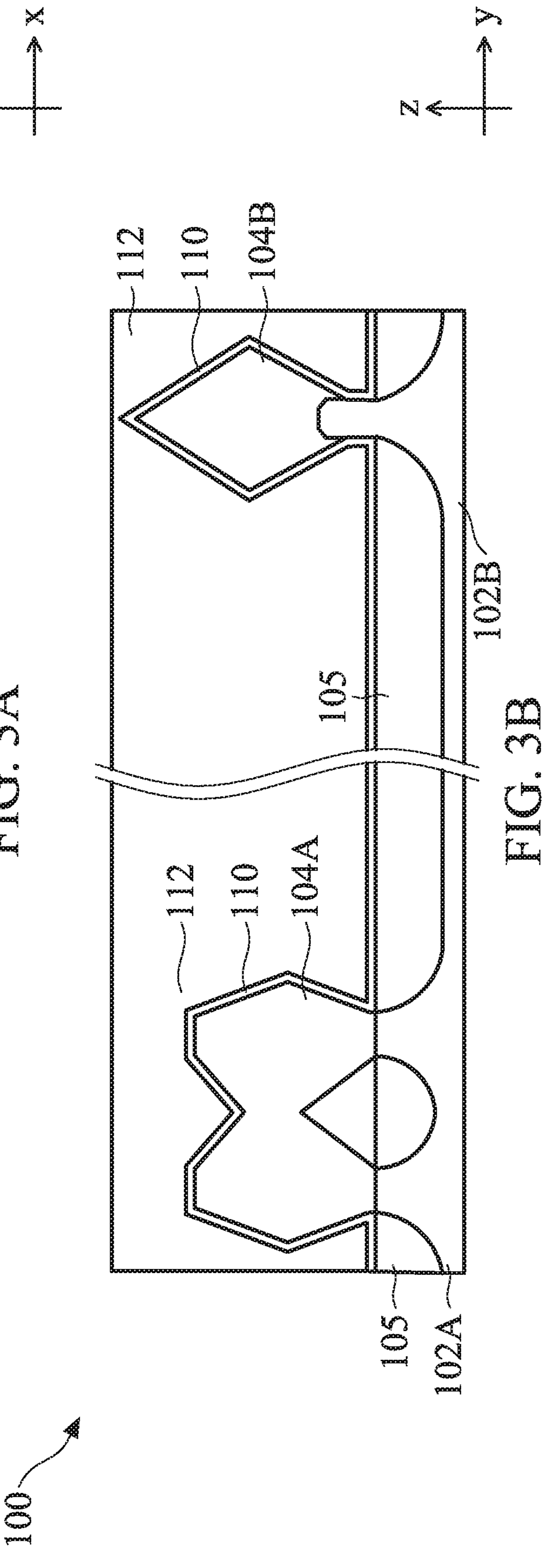
Figure 4A:
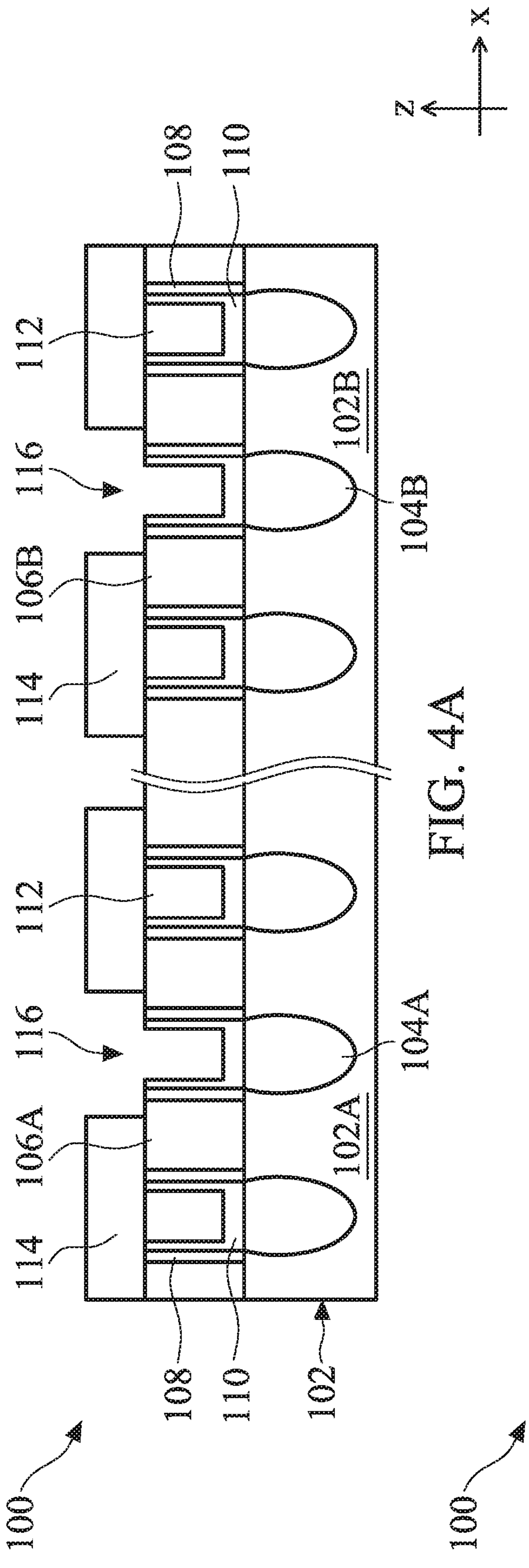
Figure 4B:
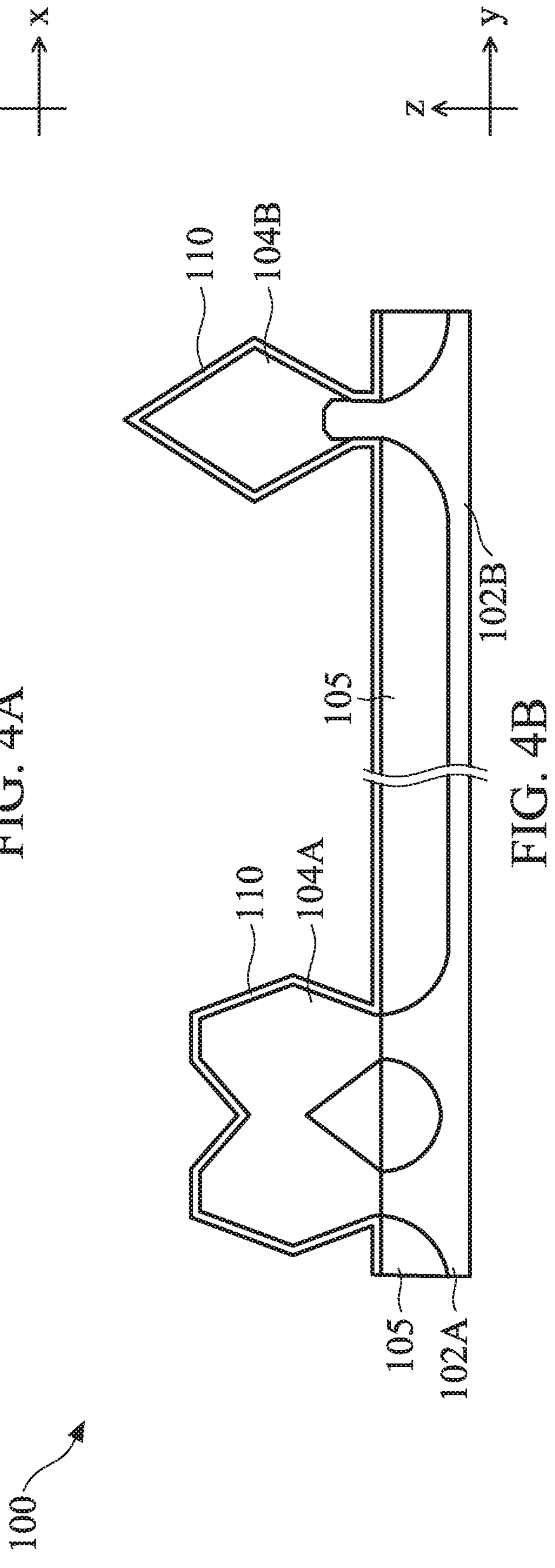
Figure 5A:
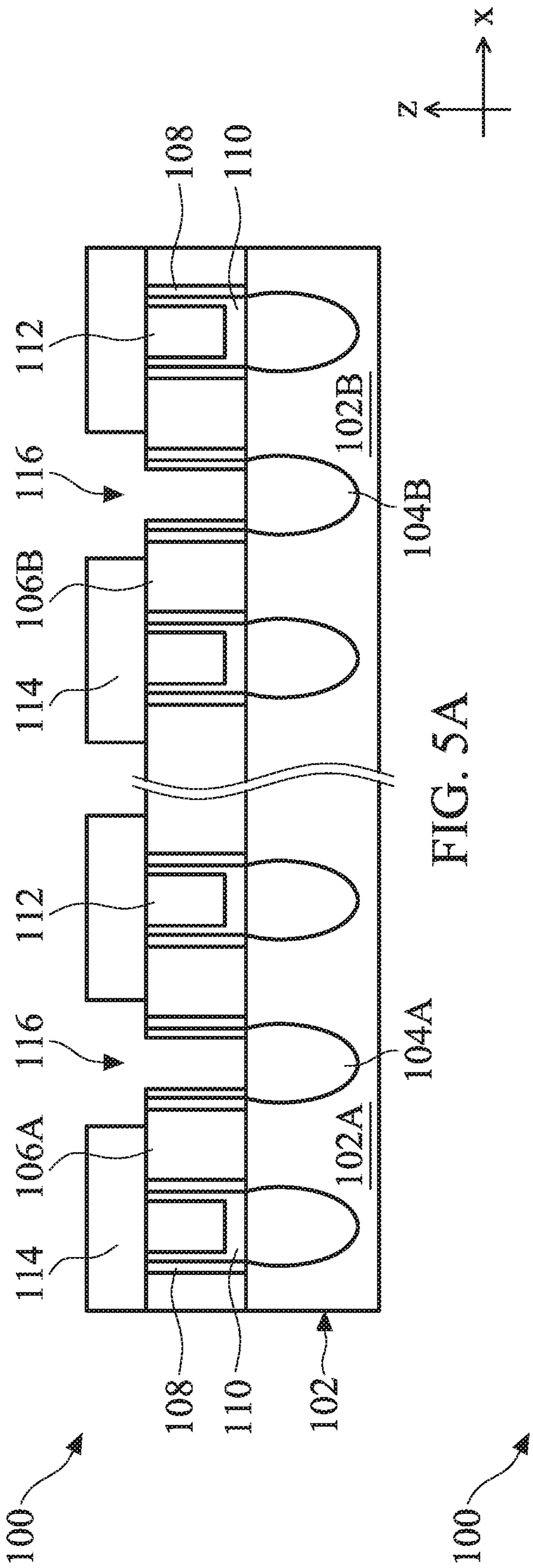
Figure 5B:
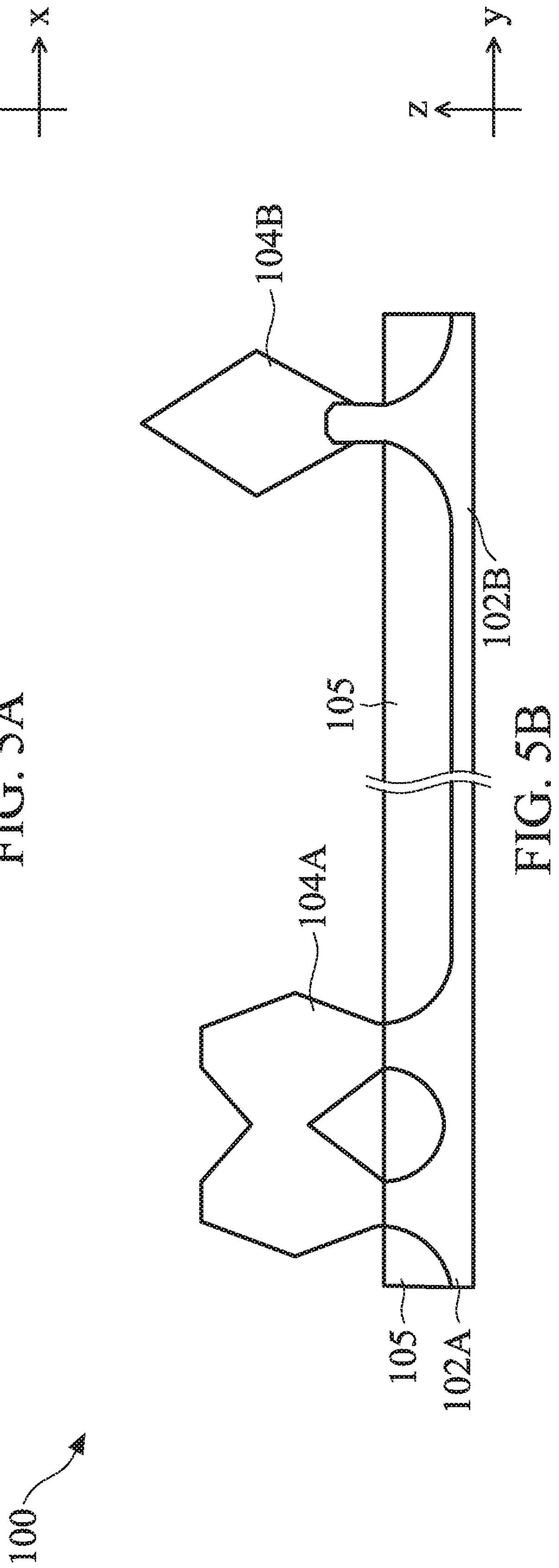

At operation 14, the method 10 (FIG. 1A) etches the dielectric layer 112 and the CESL 110 to expose the S/D features 104A and 104B, in preparation for forming S/D contacts over the respective S/D features. This may involve a variety of processes including deposition, photolithography, and etching. Referring to FIGS. 3A and 3B, an etch mask 114 is formed over the device 100, providing openings 116 exposing various portions of the device 100. The openings 116 correspond to the areas of the device 100 where S/D contacts are to be formed. In various embodiments, the etch mask 114 may include a hard mask layer (e.g., having silicon nitride or silicon oxide), a photoresist layer, or a combination thereof. Referring to FIGS. 4A and 4B, the device 100 is etched through the openings 116 to remove the exposed portions of the dielectric layer 112, for example, using a dry etching process, a wet etching process, or a reactive ion etching process. In the present embodiment, the etching process is selective to the material of the dielectric layer 112, and does not (or insignificantly) etch the gate stacks 106A and 106B, the gate spacer 108, and the CESL 110. Referring to FIGS. 5A and 5B, the device 100 is etched again through the openings 116 to remove portions of the CESL 110 at the bottom of the openings 116, for example, using a dry etching process, a wet etching process, or a reactive ion etching process. Particularly, this etching process is anisotropic. As a result, portions of the CESL 110 remain over the sidewalls of the gate stacks 106A and 106B after the etching process is finished. Further, this etching process is selective to the CESL 110, and does not (or insignificantly) etch the gate stacks 106A and 106B and the gate spacer 108. Although two separate etching processes are used in the present embodiment to etch the dielectric layer 112 and the CESL 110, in various embodiments, one joint etching process or more than two etching processes may alternatively be used.

In some embodiments, the portions of the CESL 110 over the sidewalls of the gate stacks 106A and 106B (referred to as CESL 110 sidewall) may become undesirably thin after the operation 14 finishes. For example, the CESL 110 may have a thin profile to begin with and is partially consumed by the etching process that etches the dielectric layer 112 and CESL 110. One concern with such a thin CESL 110 sidewall is that materials in the gate stacks 106A and 106B and S/D features 104A and 104B might eventually intermix to cause device defects (e.g., shorts). Another concern is the thin CESL sidewall will breakdown during voltage biasing, which eventually leads to shorting the respective S/D feature and the gate stack. In the present embodiment, a protective sidewall 118 is formed over the CESL 110 sidewall to increase the thickness of the dielectric layer(s) on the gate stacks 106A and 106B.

Figure 6A:
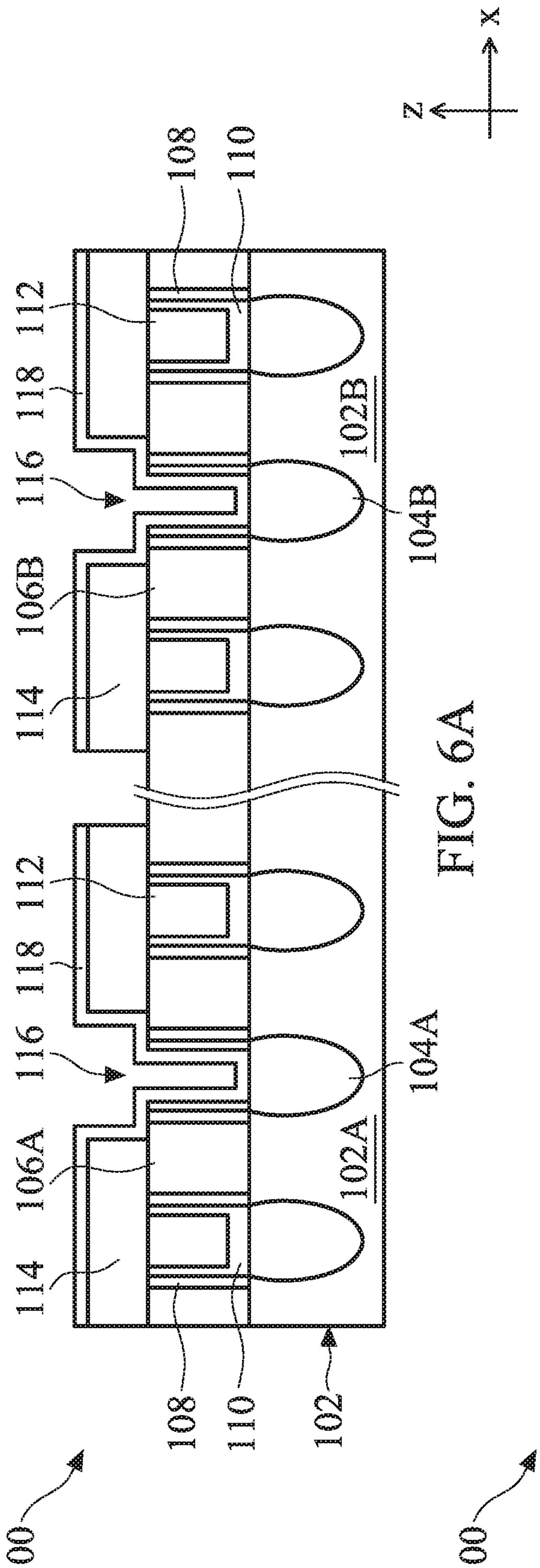
Figure 6B:
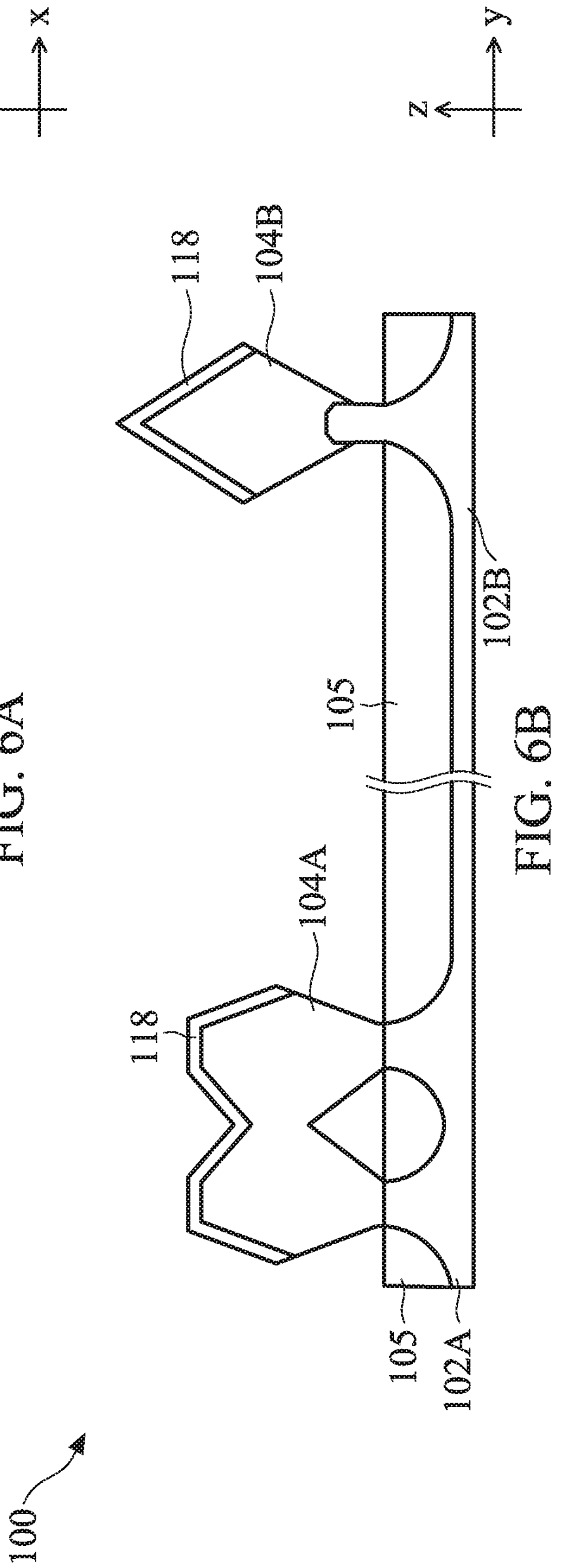
Figure 7A:
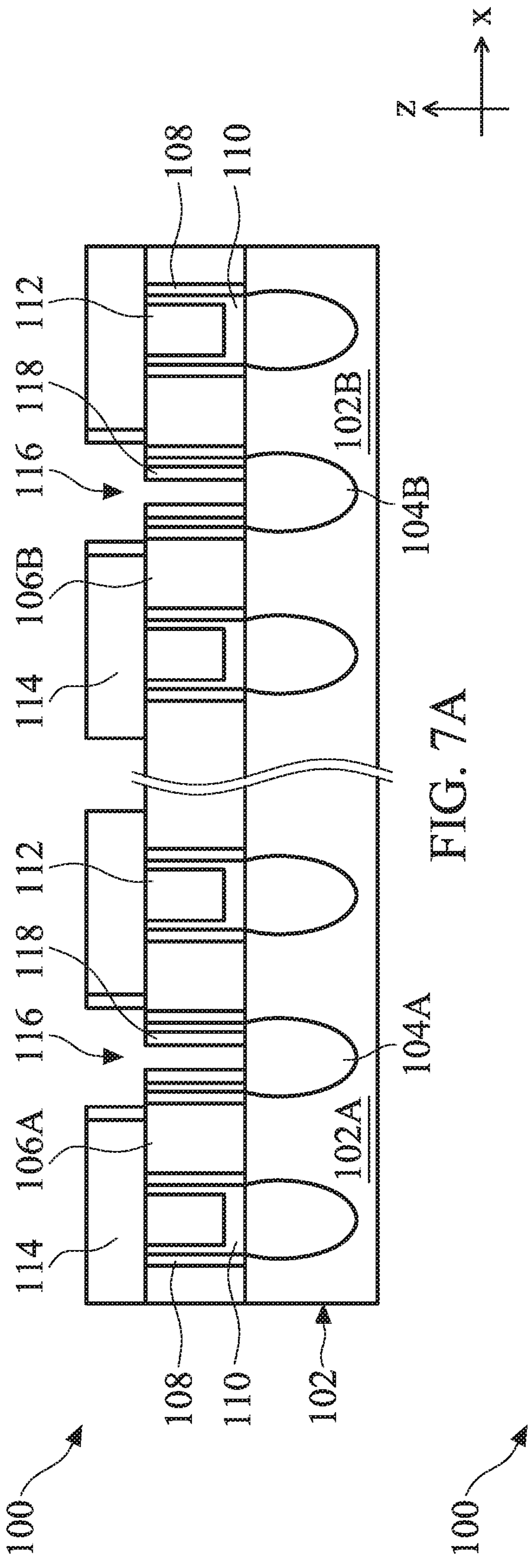
Figure 7B:
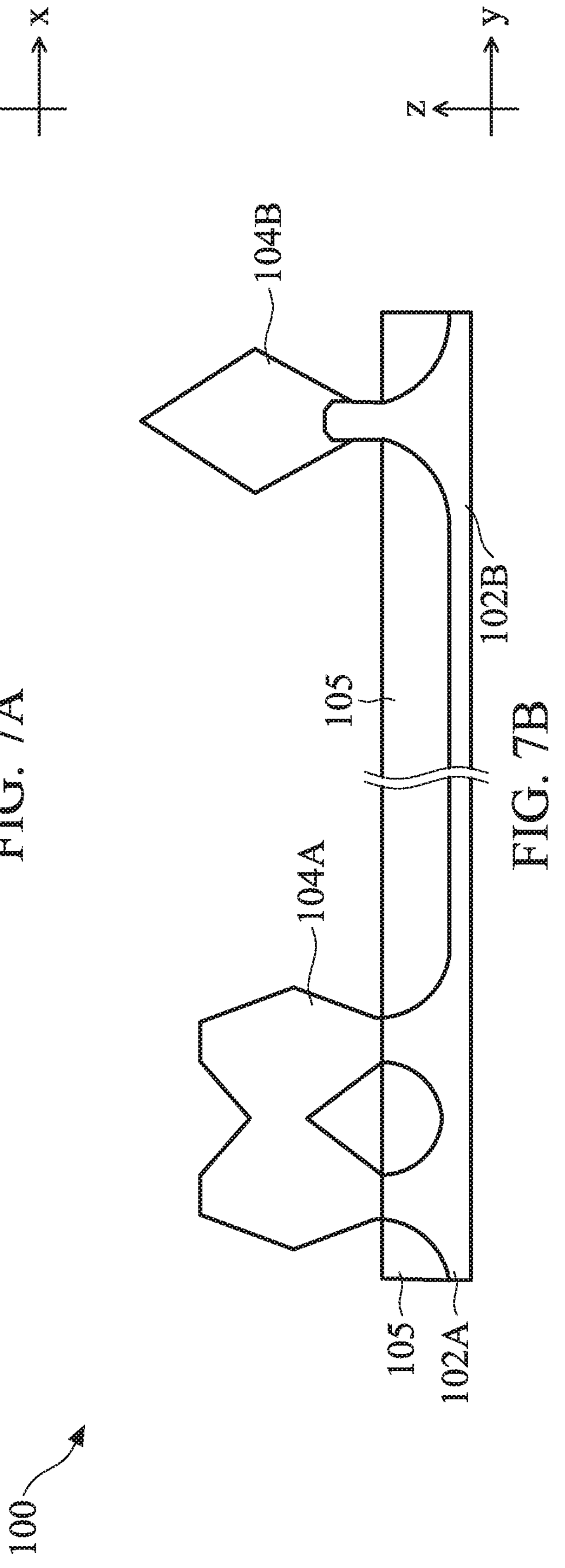

At operation 16, the method 10 (FIG. 1A) forms the protective sidewall 118 by performing a deposition process and an etching process. Referring to FIGS. 6A and 6B, the method 10 deposits a dielectric layer 118 over the device 100, particularly over the sidewalls of the openings 116 and on top of the S/D features 104A and 104B. In an embodiment, the dielectric layer 118 includes silicon nitride. Alternatively, the dielectric layer 118 may include silicon oxynitride, silicon carbide nitride, or other suitable material(s). The dielectric layer 118 may be deposited using a CVD, PVD, or ALD method. Referring to FIGS. 7A and 7B, the method 10 anisotropically etches the dielectric layer 118, leaving portions of the dielectric 118 over the sidewalls of the openings 116, particularly over the CESL 110 sidewall as a protective layer. The protective sidewall 118 advantageously increases the thickness of the dielectric layer(s) on the sidewalls of the gate stacks 106A and 106B. The etching process is dry etching in an embodiment. In some embodiments of the method 10 where the CESL 110 sidewall has sufficient thickness after the operation 14 finishes, the operation 16 is not performed. After the etching processes of the operation 14 and (optionally) operation 16, the S/D features 104A and 104B (or portions thereof) are exposed through the openings 116 as shown in FIGS. 5A, 5B, 7A, and 7B.

In some embodiments, the S/D features 104A and 104B may have been etched during the various etching processes discussed above including the etching of the CESL 110 and the optional etching of the dielectric layer 118. For example, when etching the CESL 110 to expose the S/D features 104A and 104B, some over-etching may be performed to ensure that there is no dielectric residue on the respective S/D features. Otherwise, S/D contact resistance might be undesirably high, or circuit open defects might ensue. However, such over-etching may inadvertently etch the S/D features 104A and 104B. In some embodiments, the S/D features 104A and 104B may be intentionally etched to increase their interfacial area for S/D contact formation. Either the inadvertent over-etching or the intentional etching may alter the structure of the S/D features and impact the device performance. In a particular example, the S/D features 104B include silicon germanium for applying strain (or stress) to the p-type FinFETs, and etching of the S/D features 104B usually relaxes that strain undesirably. In order to reinforce or increase the strain in the S/D features 104B, the method 10 dopes a p-type dopant into the S/D features 104B according to the present embodiment.

Figure 8A:
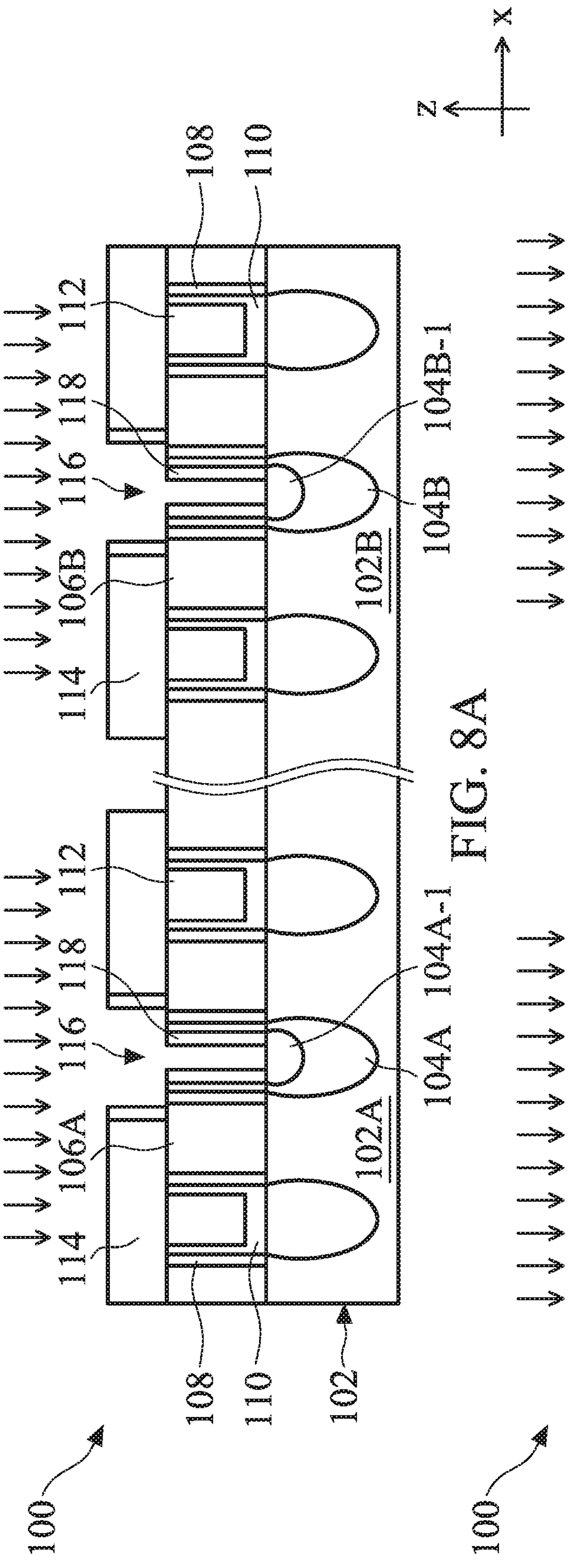
Figure 8B:
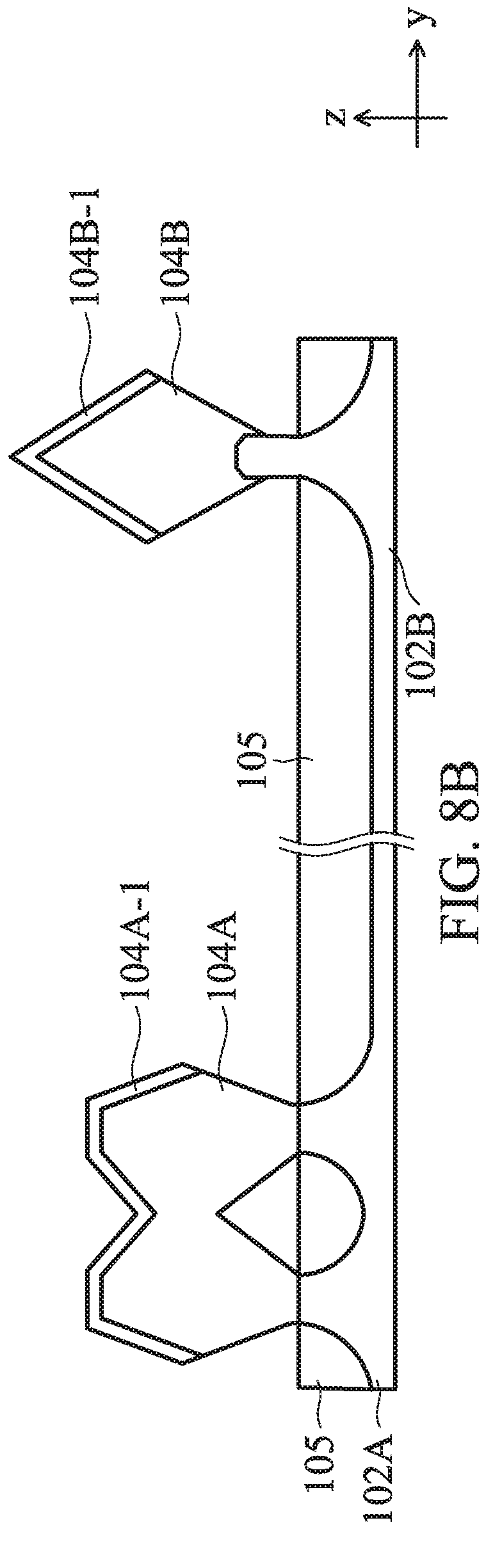

At operation 18, the method 10 (FIG. 1A) dopes a p-type dopant into the S/D features 104B (FIGS. 8A and 8B). Particularly, the method 10 dopes the p-type dopant into both the S/D features 104B and the S/D features 104A. As illustrated in FIGS. 8A and 8B, a portion 104A-1 of the S/D features 104A is doped with the p-type dopant, and a portion 104B-1 of the S/D features 104B is also doped with the p-type dopant. In an embodiment, the S/D features 104A is n-type doped (e.g., having phosphorous doped silicon or phosphorous doped silicon-carbon) prior to the operation 18. Therefore, the portion 104A-1 is counter-doped by the operation 18 to have both n-type and p-type dopants. One approach to avoid this counter doping is to form a doping mask that masks the S/D features 104A when doping the p-type dopant into the S/D features 104B. However, forming this doping mask not only involves extra material costs and fabrication time, but also introduces other problems into the fabrication. For example, creating this doping mask may require some over-etching in the PFET region 102B to ensure that there is no mask residue on the S/D features 104B. Such over-etching often leads to reduced mask area over the S/D features 104A. Consequently, doping the S/D features 104B may unexpectedly introduce p-type dopants to the S/D features 104A. In the present embodiment, the method 10 dopes the p-type dopant into both the S/D features 104A and 104B, and then selectively etches the S/D features 104A and 104B to remove the counter-doped portions 104A-1. This obviates the needs of creating the doping mask.

In an embodiment, the S/D features 104A include phosphorous doped silicon or silicon-carbon and the S/D features 104B include silicon germanium which may be doped or undoped. To further this embodiment, the operation 18 dopes boron into the S/D features 104A and 104B. The operation 18 controls the level of doping energy to ensure that the dopants reach certain depths into the respective S/D features. In some embodiments, the doping energy ranges from 1 keV to 5 keV. The operation 18 also controls the level of doping dose to ensure proper performance of the p-type FinFET. In some embodiments, the doping dose ranges from 1E15 $cm^{-2}$ to 1E16 $cm^{-2}$.

At operation 20, the method 10 (FIG. 1A) activates the p-type dopants in the p-type S/D features 104B by performing an annealing process. Since the p-type dopant is also introduced into the n-type S/D features 104A, this annealing process is carefully selected to minimize diffusion of the p-type dopant in the n-type S/D features 104A. For example, the operation 20 may utilize dynamic spike annealing (DSA) which ramps temperature up and down within milli-seconds, or melting laser annealing (MLA) which ramps temperature up and down within nanoseconds. Other types of annealing with very fast temperature ramping rates may also be used. In an embodiment of the method 10, the operation 20 is not performed. Rather, the activation of the p-type dopant is performed after the counter-doped portions 104A-1 have been removed (discussed below).

Figure 9A:
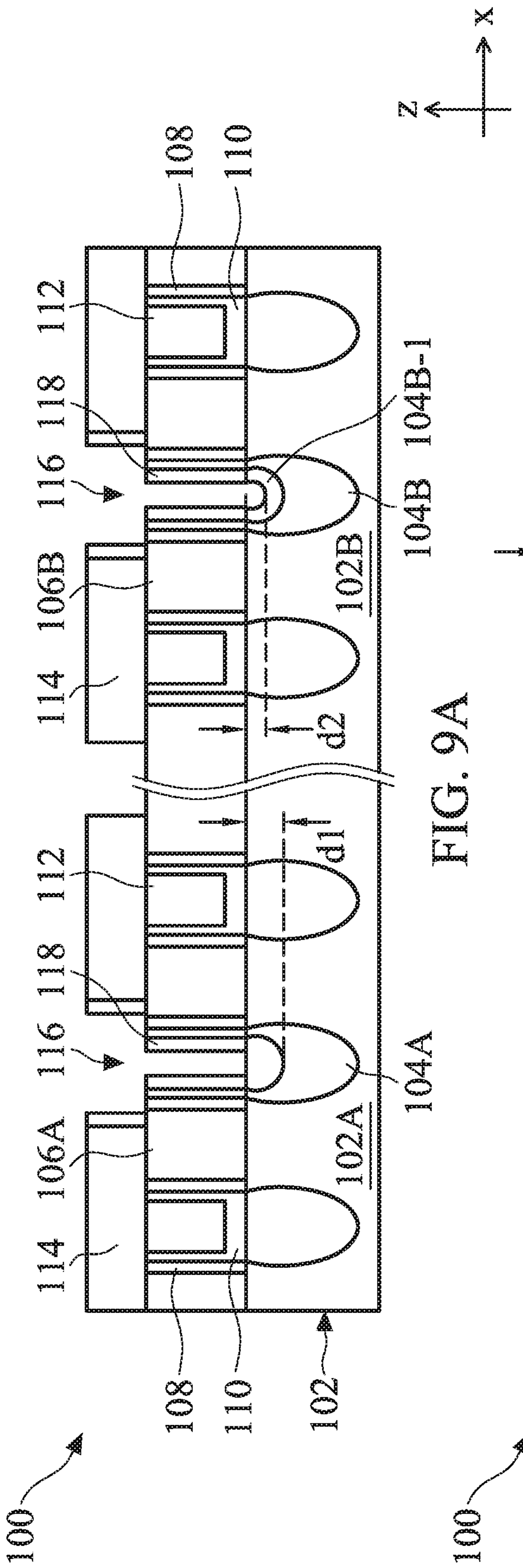
Figure 9B:
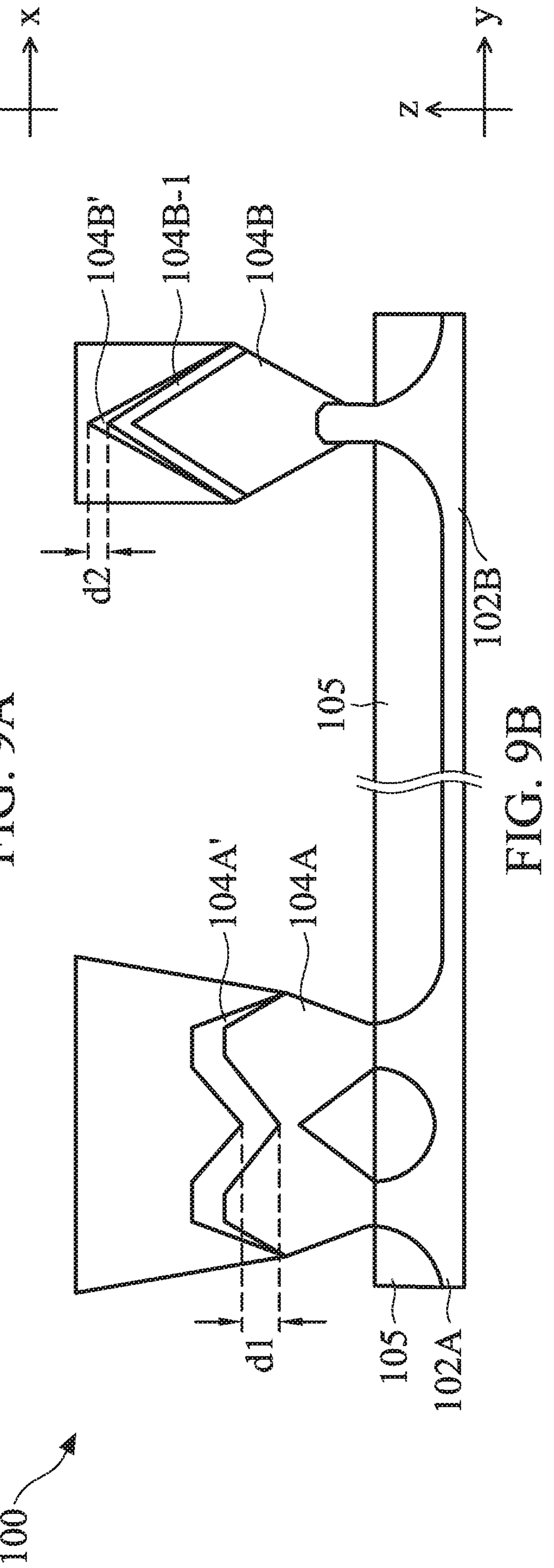

At operation 22, the method 10 (FIG. 1B) performs a selective etching process to the S/D features 104A and 104B. In the present embodiment, the selective etching process is tuned to etch the S/D features 104A at a faster rate than it etches the S/D features 104B. As illustrated in FIGS. 9A and 9B, when it finishes, the operation 22 completely removes the counter-doped portions 104A-1, and only partially removes the doped portions 104B-1. Further, the different etching rates in the NFET region 102A and PFET region 102B result in different etching depths into the S/D features 104A and 104B. More specifically, the S/D features 104A are etched (or partially removed) by a depth d1, the S/D features 104B are etched (or partially removed) by a depth d2, and d1 is greater than d2. In an embodiment, d1 may be measured from the lowest point of the upper surface of the etched S/D feature 104A to a bottom surface of an adjacent gate spacer 108 as illustrated in FIG. 9A. Alternatively, d1 may be measured from the lowest point of the upper surface of the etched S/D feature 104A to a corresponding point of the upper surface of an adjacent un-etched S/D feature 104A, where the two points have the same "y" coordinate, but different "x" coordinates, as illustrated in FIG. 9B. FIG. 9B illustrates a "y-z" cross-section of the etched S/D feature 104A overlapping with (in front of) another "y-z" cross-section of an un-etched S/D feature 104A'. The difference between the two points along the "z" direction represents the etching depth into the S/D feature 104A. The depth d2 may be measured similarly. Particularly, FIG. 9B illustrates a "y-z" cross-section of the etched S/D feature 104B overlapping with (in front of) another "y-z" cross-section of an un-etched S/D feature 104B'. The difference between the two points along the "z" direction represents the etching depth into the S/D feature 104B. In various embodiments, the depth d1 is greater than the depth d2 by at least 5 nm. In the NFET region 102A, the greater etching depth into the S/D features 104A generally leads to increased interfacial area for S/D contacts and therefore reduced S/D contact resistance. In the PFET region 102B, the less etching depth into the S/D features 104B helps maintain the stress/strain built into the S/D features 104B. Still further, the etching process is tuned not to etch the gate stacks 106A and 106B, the gate spacer 108, the CESL 110, and the dielectric layer 118. The etching process may include dry etching or wet etching. In an embodiment, the etching process is dry etching using a gas mixture of $SF_6$, $H_2$, and $CF_4$ as the etchant. Combination of these gases results in the formation of a carbon-and-sulfur containing passivation layer over the semiconductor materials of the S/D features 104A and 104B. This passivation layer is more likely to produce over the S/D features 104B having silicon germanium than over the S/D features 104A having silicon, which effectively reduces the etching rate of the S/D features 104B in the etching process. In another embodiment, the etching process is wet etching using an etchant having ammonium hydroxide ($NH_4OH$) or tetramethylammonium hydroxide (TMAH) which has a higher etching rate for silicon than for silicon germanium.

It is noted that both the p-type doping (operation 18) and the selective etching process (operation 22) are performed to the S/D features 104A and 104B simultaneously without the need of masking either type of the S/D features. This advantageously saves material costs and fabrication time.

At operation 24, the method 10 (FIG. 1B) activates the p-type dopants in the S/D features 104B by performing an annealing process. Since the counter-doped portions 104A-1 have been removed, the operation 24 may select from a variety of annealing processes without the concern of minimizing p-type dopant diffusion in the S/D features 104A. For example, the operation 24 may use one or more annealing processes such as microwave annealing (MWA) process, microsecond annealing (μSSA) process, rapid thermal annealing (RTA) process, dynamic spike annealing (DSA) process, melting laser annealing (MLA) process, and/or other suitable annealing processes. However, the temperature budget of the operation 24 may take into account the materials of the gate stacks 106A and 106B so as not to damage the gate stacks. It is noted that, the operation 24 may be omitted if the operation 20 has been performed.

At operation 26, the method 10 (FIG. 1B) cleans the surfaces of the S/D features 104A and 104B, and get them ready for a subsequent silicidation process. The operation 26 may use a dry cleaning process or a wet cleaning process. For example, a dry cleaning process may use SiConi etch, which is a remote plasma assisted dry etch process involving the simultaneous exposure of an object to $H_2$, $NF_3$ and $NH_3$ plasma by-products. For example, a wet cleaning process may use diluted hydrofluoric acid (DHF) solution to clean the surfaces of the S/D features 104A and 104B.

Figure 10A:
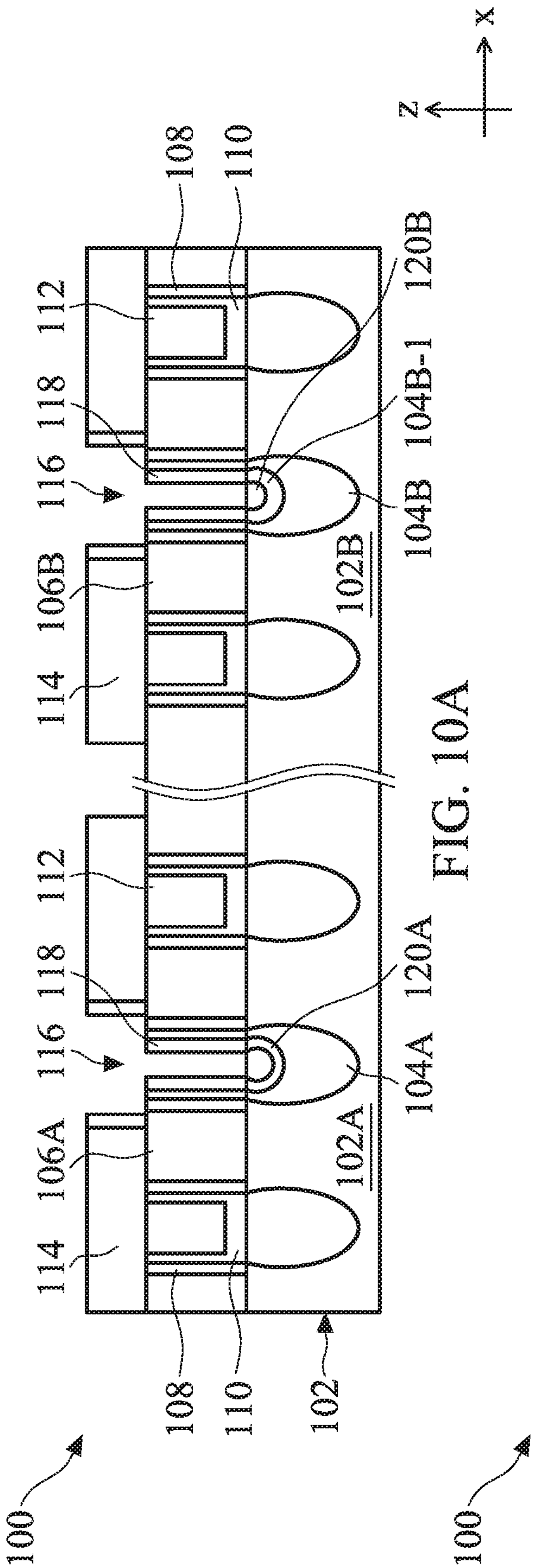
Figure 10B:
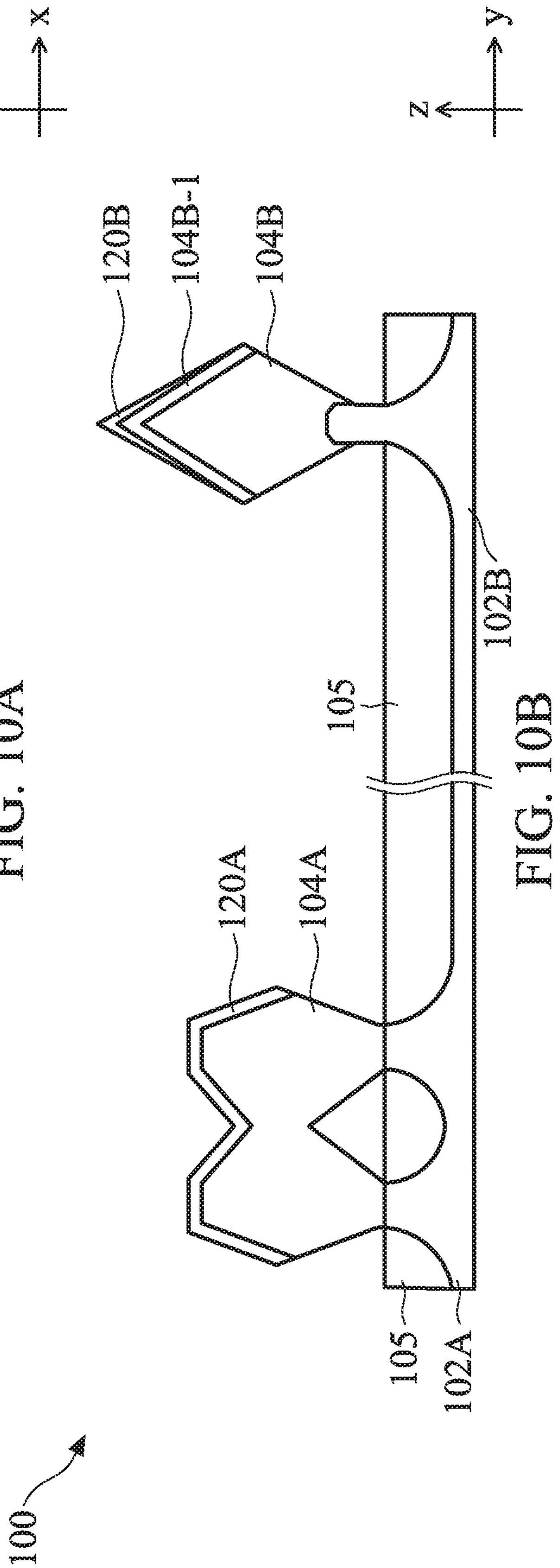

At operation 28, the method 10 (FIG. 1B) forms silicide features 120A and 120B over the S/D features 104A and 104B, respectively, for reducing S/D contact resistance. In an example embodiment, the method 10 deposits a metal film over the S/D features 104A and 104B, performs an annealing process to cause reaction between the metal film and the underlying semiconductor material, and removes excess unreacted metal. The remaining metal semiconductor materials become the silicide features 120A and 120B, as shown in FIGS. 10A and 10B. For example, the metal film may have a thickness of about 10 nm or less, such as 5 nm or less. In embodiments, the same metal film may be used for silicidation of both n-type and p-type S/D regions. Alternatively, the metal film used for silicidation of the n-type S/D features 104A may be different from the metal film used for silicidation of the p-type S/D features 104B. In various embodiments, the metal film may include titanium (Ti), nickel (Ni), cobalt (Co), tantalum (Ta), erbium (Er), yttrium (Y), ytterbium (Yb), platinum (Pt), or combinations thereof.

Figure 11A:
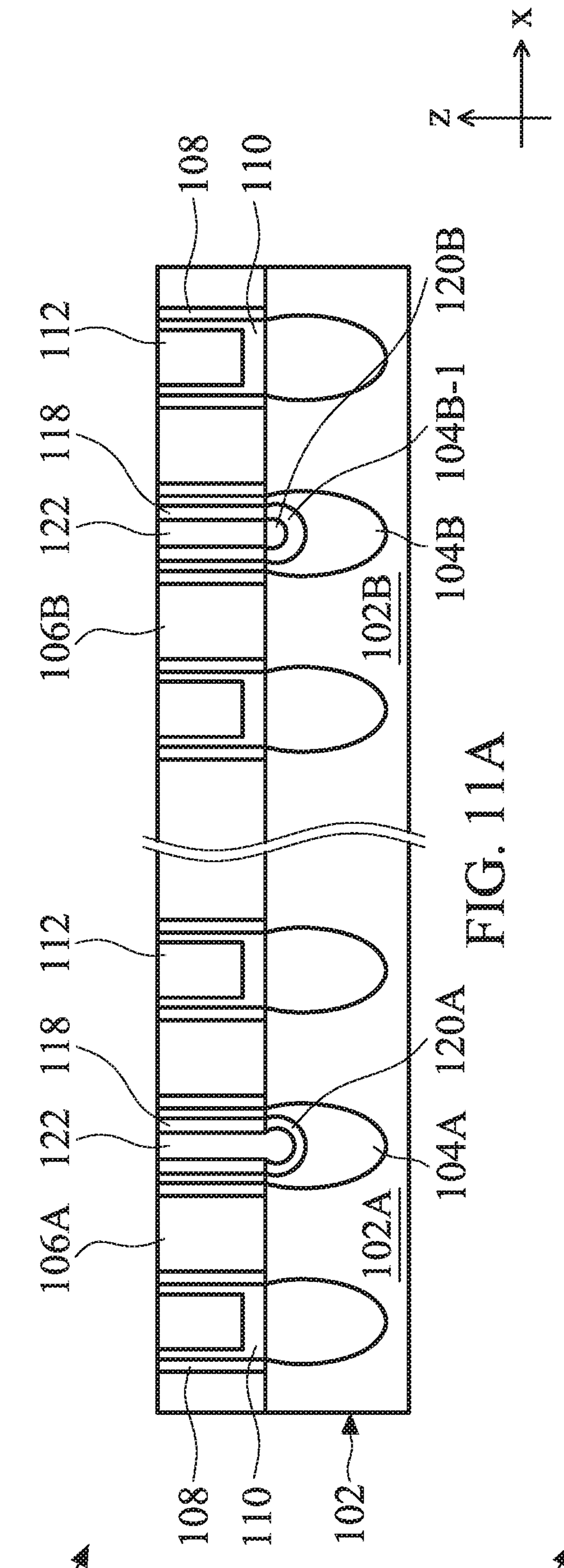
Figure 11B:
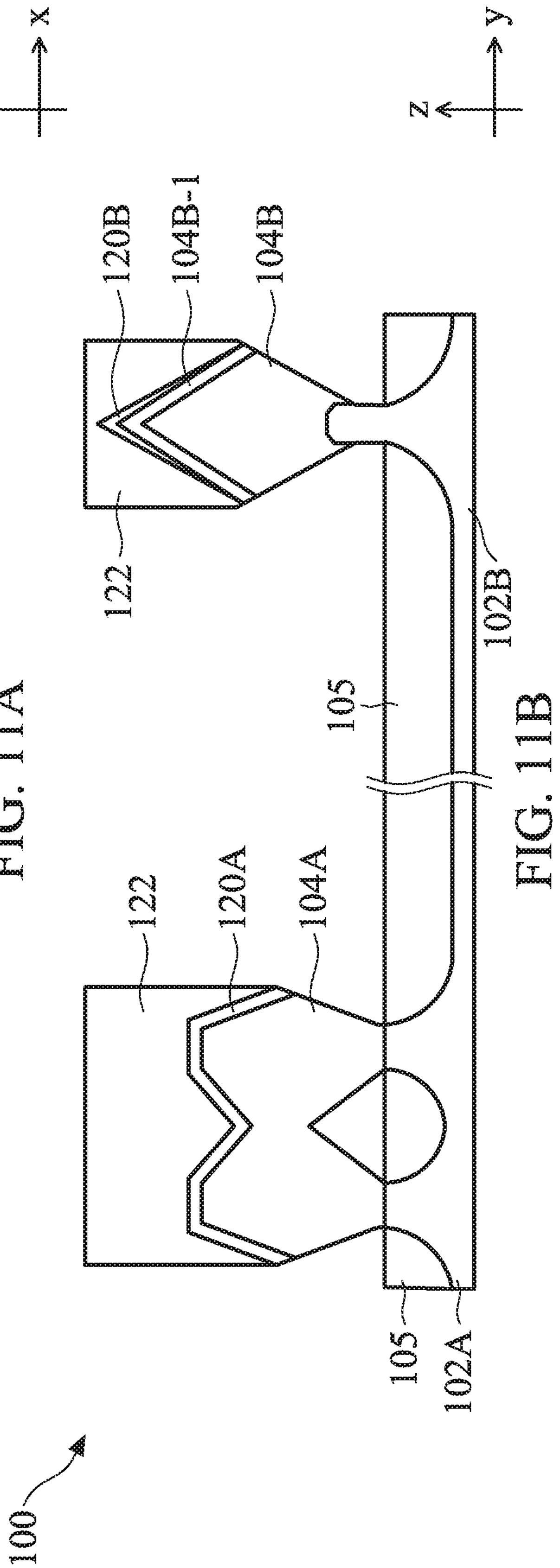

At operation 30, the method 10 (FIG. 1B) forms S/D contacts 122 over the silicide features 120A and 120B by depositing a metal in the openings 116. Referring to FIGS. 11A and 11B, the S/D contacts 122 fill the openings 116 and cover the top and side surfaces of the S/D features 104A and 104B through the silicide features 120A and 120B, respectively. In embodiments, the S/D contacts 122 may comprise tungsten (W), cobalt (Co), copper (Cu), other elemental metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes. In an embodiment, the masking element 114 is removed before depositing the metal for the contacts 122. Further, a CMP process may be performed to planarize a top surface of the device 100 to obtain the structure as shown in FIGS. 11A and 11B.

Still referring to FIGS. 11A and 11B, the bottom surface of the S/D contact 122 in the NFET region 102A is lower than the bottom surface of the S/D contact 122 in the PFET region 102B. This results from the selective etching process at the operation 22. In the PFET region 102B, the S/D contact 122 is disposed over a multi-layer structure including the p-type S/D feature 104B, the portion 104B-1 doped with extra p-type dopant, and the silicide feature 120B. Further, the sidewalls of the S/D contacts 122 are sandwiched between the protective dielectric layer 118, the CESL 110, the gate spacer 108, and the gate stacks 106A (in the NFET region 102A) and 106B (in the PFET region 102B).

At operation 32, the method 10 (FIG. 1B) performs further steps to complete the fabrication of the device 100. For example, operation 32 may form a gate contact electrically connecting the gate stacks 106A and 106B, and may form metal interconnects connecting the FinFETs as well as other portions of the device 100 to form a complete IC.

Although not intended to be limiting, one or more embodiments of the present disclosure provide many benefits to a semiconductor device and a formation process thereof. For example, when forming S/D contacts for FINFET devices, embodiments of the present disclosure dope extra p-type dopants into p-type S/D features to reduce the resistance therein. The doping is performed without a doping mask for n-type S/D features, thereby simplifying the manufacture process and reducing manufacture costs. The counter-doped portions in the n-type S/D features are subsequently removed through a selective etching process without an etching mask for p-type devices, which again simplifying the manufacture process and reducing manufacture costs. The provided subject matter can be easily integrated into existing IC fabrication flow and can be applied to many different process nodes.

In one exemplary aspect, the present disclosure is directed to a method of forming a semiconductor device. The method includes providing a structure that includes: a substrate; a first gate structure and a second gate structure over the substrate; a first source/drain (S/D) feature and a second S/D feature over the substrate, wherein the first S/D feature is adjacent to the first gate structure, the second S/D feature is adjacent to the second gate structure, and the first and second S/D features comprise different materials; a first dielectric layer over sidewalls of the first and second gate structures and over the first and second S/D features; and a second dielectric layer over the first dielectric layer. The method further includes etching the first and second dielectric layers to expose the first and second S/D features, doping a p-type dopant to the first and second S/D features, and performing a selective etching process to the first and second S/D features after the doping of the p-type dopant. The selective etching process recesses the first S/D feature faster than it recesses the second S/D feature.

In an embodiment of the method, the first S/D feature comprises silicon or silicon-carbon doped with an n-type dopant, and the second S/D feature comprises silicon germanium. In a further embodiment of the method, the n-type dopant is phosphorus or arsenic and the p-type dopant is boron. In a further embodiment of the method, the selective etching process includes a dry etching process using a gas mixture of $SF_6$, $H_2$, and $CF_4$, or a wet etching process using $NH_4OH$ or TMAH.

In an embodiment of the method, the doping of the p-type dopant uses a doping energy ranging from 1 keV to 5 keV and a doping dose of the p-type dopant ranging from 1E15 $cm^{-2}$ to 1E16 $cm^{-2}$.

In another embodiment, after the etching of the first and second dielectric layer and before the doping of the p-type dopant, the method further includes depositing a third dielectric layer over the structure, and performing an anisotropic etching process to the third dielectric layer to expose the first and second S/D features and to keep a portion of the third dielectric layer over sidewalls of the first and second gate structures.

In an embodiment, after the performing of the selective etching process, the method further includes annealing the p-type dopant in the second S/D feature. In an alternative embodiment, before the performing of the selective etching process, the method further includes annealing the p-type dopant in at least the second S/D feature.

In an embodiment, after the performing of the selective etching process, the method further includes depositing a metal over remaining portions of the first and second S/D features. In a further embodiment, after the performing of the selective etching process and before the depositing of the metal, the method further includes forming a first silicide feature over the remaining portion of the first S/D feature, and forming a second silicide feature over the remaining portion of the second S/D feature.

In another exemplary aspect, the present disclosure is directed to a method of forming a semiconductor device. The method includes providing a structure that includes: a substrate; a first gate structure and a second gate structure over the substrate; a first source/drain (S/D) feature comprising n-type doped silicon adjacent to the first gate structure; a second S/D feature comprising silicon germanium adjacent to the second gate structure; and one or more dielectric layers over sidewalls of the first and second gate structures and over the first and second S/D features. The method further includes etching the one or more dielectric layers to expose the first and second S/D features, doping a p-type dopant to the first and second S/D features by a same doping process, resulting in a p-type doped portion of the first S/D feature and a p-type doped portion of the second S/D feature, and partially etching the first and second S/D features by a same etching process after the doping of the p-type dopant, wherein the etching process recesses the first S/D feature at a faster rate than it recesses the second S/D feature.

In an embodiment of the method, the p-type dopant comprises boron and the doping process uses a doping energy ranging from 1 keV to 5 keV and a doping dose ranging from 1E15 $cm^{-2}$ to 1E16 $cm^{-2}$. In another embodiment of the method, the same etching process completely removes the p-type doped portion of the first S/D feature and partially removes the p-type doped portion of the second S/D feature. In an embodiment of the method, the same etching process includes dry etching with a gas mixture of $SF_6$, $H_2$, and $CF_4$. In another embodiment of the method, the same etching process includes wet etching with $NH_4OH$ or TMAH.

In an embodiment, after the partially etching of the first and second S/D features, the method further includes activating the p-type dopant in the second S/D feature. In a further embodiment, after the activating of the p-type dopant, the method further includes cleaning a top surface of the first and second S/D features using a dry cleaning process or a wet cleaning process, forming a first silicide feature over the first S/D feature, and forming a second silicide feature the second S/D feature.

In yet another exemplary aspect, the present disclosure is directed to a method of forming a semiconductor device. The method includes providing a structure that includes: a substrate; a first gate structure over the substrate; two first source/drain (S/D) features comprising phosphorus doped silicon sandwiching the first gate structure; a second gate structure over the substrate; two second S/D features comprising silicon germanium sandwiching the second gate structure; a gate spacer layer on sidewalls of the first and second gate structures; and one or more dielectric layers over the gate spacer layer and over the first and second S/D features. The method further includes etching the one or more dielectric layers to form openings that expose the first and second S/D features; forming a protective sidewall in the openings; doping boron to the first and second S/D features by a same doping process, resulting in a boron-doped portion of the first S/D features and a boron-doped portion of the second S/D features; and after the doping of boron, etching the first and second S/D features by a same etching process, wherein the etching process completely removes the boron-doped portion of the first S/D features and partially removes the boron-doped portion of the second S/D features. In an embodiment, after the etching of the first and second S/D features, the method further includes annealing the first and second S/D features.

In one exemplary aspect, the present disclosure is directed to a method. The method includes providing a structure that includes: a substrate; a first gate structure and a second gate structure over the substrate; a spacer layer over sidewalls of the first and second gate structures; a first source/drain (S/D) feature and a second S/D feature over the substrate, wherein the first S/D feature is adjacent to the first gate structure, the second S/D feature is adjacent to the second gate structure, and the first and second S/D features comprise different materials; an etch stop layer over sidewalls of the spacer layer and over the first and second S/D features; and an oxide layer over the etch stop layer. The method further includes forming a masking layer over the structure, the masking layer having openings directly over the first and second S/D features; etching the oxide layer and the etch stop layer through the openings to expose the first and second S/D features; doping a p-type dopant to the first and second S/D features through the openings; and after the doping of the p-type dopant, performing an etching process to the first and second S/D features, wherein the etching process recesses the first S/D feature faster than it recesses the second S/D feature.

In an embodiment, after the etching of the oxide layer and the etch stop layer and before the doping of the p-type dopant, the method further includes depositing a dielectric layer comprising silicon nitride over the first and second S/D features and onto sidewalls of the openings; and etching the dielectric layer to expose the first and second S/D features and to keep a portion of the dielectric layer on the sidewalls of the openings. In another embodiment, after the performing of the etching process to the first and second S/D features, the method further includes activating the p-type dopant in the second S/D feature. In a further embodiment, after the activating, the method further includes depositing a metal over remaining portions of the first and second S/D features.

In another exemplary aspect, the present disclosure is directed to a method. The method includes providing a structure that includes: a substrate; a first epitaxial feature and a second epitaxial feature over the substrate, wherein the first and second epitaxial features comprise different semiconductor materials; and one or more dielectric layers over the first and second epitaxial features. The method further includes forming a masking layer over the structure, the masking layer having openings directly over the first and second epitaxial features; etching the one or more dielectric layers through the openings to expose the first and second epitaxial features; forming a protective sidewall in the openings; doping a p-type dopant to the first and second epitaxial features through the openings, resulting in a first doped portion in the first epitaxial feature and a second doped portion in the second epitaxial feature; and performing a selective etching process to the first and second epitaxial features, wherein the selective etching process completely removes the first doped portion and partially removes the second doped portion.

In an embodiment of the method, the first epitaxial feature comprises phosphorous doped silicon, the second epitaxial feature comprises silicon germanium, and the p-type dopant comprises boron. In a further embodiment, the selective etching process includes a dry etching process using a gas mixture of $SF_6$, $H_2$, and $CF_4$. In an alternative further embodiment, the selective etching process includes a wet etching process using $NH_4OH$ or TMAH.

In yet another exemplary aspect, the present disclosure is directed to a semiconductor device. The semiconductor device includes an n-type FinFET region that includes a first gate stack; a first gate spacer over sidewalls of the first gate stack; and an n-type epitaxial feature in a source/drain (S/D) region of the n-type FinFET region. The semiconductor device further includes a p-type FinFET region that includes a second gate stack; a second gate spacer over sidewalls of the second gate stack; and a p-type epitaxial feature in an S/D region of the p-type FinFET region. A first vertical distance between a bottom surface of the first gate spacer and a lowest point of an upper surface of the n-type epitaxial feature is greater than a second vertical distance between a bottom surface of the second gate spacer and a lowest point of an upper surface of the p-type epitaxial feature. In an embodiment of the semiconductor device, the first vertical distance is greater than the second vertical distance by at least 5 nanometers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an n-type FET device including:
a first substrate region;
a first gate stack over the first substrate region;
a first gate spacer over sidewalls of the first gate stack; and
an n-type semiconductor layer in a source/drain (S/D) region of the n-type FET device; and
a p-type FET device including:
a second substrate region;
a second gate stack over the second substrate region;
a second gate spacer over sidewalls of the second gate stack; and
a p-type semiconductor layer in an S/D region of the p-type FET device,
wherein a first vertical distance between a bottom surface of the first gate spacer and a lowest point of an upper surface of the n-type semiconductor layer is greater than a second vertical distance between a bottom surface of the second gate spacer and a lowest point of an upper surface of the p-type semiconductor layer.

2. The semiconductor device of claim 1, wherein the first vertical distance is greater than the second vertical distance by at least 5 nanometers.

3. The semiconductor device of claim 1, wherein the n-type semiconductor layer includes two epitaxially grown semiconductor layers that are merged with each other.

4. The semiconductor device of claim 3, wherein the lowest point of the upper surface of the n-type semiconductor layer is proximate to a center of the two epitaxially grown semiconductor layers.

5. The semiconductor device of claim 1, further comprising a first silicide layer on the upper surface of the n-type semiconductor layer and a second silicide layer on the upper surface of the p-type semiconductor layer.

6. The semiconductor device of claim 5, wherein each of the first and the second silicide layers includes titanium (Ti), nickel (Ni), cobalt (Co), tantalum (Ta), erbium (Er), yttrium (Y), ytterbium (Yb), platinum (Pt), or combinations thereof.

7. The semiconductor device of claim 5, wherein a vertical distance from a lowest point of an upper surface of the first silicide layer to the bottom surface of the first gate spacer is greater than a vertical distance from a lowest point of an upper surface of the second silicide layer to the bottom surface of the second gate spacer.

8. The semiconductor device of claim 5, further comprising a first contact disposed on the first silicide layer and a second contact disposed on the second silicide feature layer.

9. The semiconductor device of claim 8, wherein a bottom surface of the first contact is lower than a bottom surface of the second contact.

10. A semiconductor device, comprising:
first and second gate stacks;
first and second gate spacers over sidewalls of the first and second gate stacks respectively;
first and second source/drains adjacent the first and second gate stacks respectively and comprising different semiconductor materials;
first and second contacts disposed over the first and second source/drains respectively, wherein a bottom surface of the first contact is lower than a bottom surface of the second contact;
a contact etch stop layer over sidewalls of the first and second gate spacers and over the first and second source/drains; and
a protective dielectric layer between the contact etch stop layer and the first and second contacts.

11. The semiconductor device of claim 10, further comprising:
first and second silicide layers between the first and second source/drains and the first and second contacts respectively, wherein the first and second silicide layers comprise a same metal.

12. The semiconductor device of claim 10, wherein each of the first and the second silicide layers includes titanium (Ti), nickel (Ni), cobalt (Co), tantalum (Ta), erbium (Er), yttrium (Y), ytterbium (Yb), platinum (Pt), or combinations thereof.

13. The semiconductor device of claim 10, wherein the protective dielectric layer includes silicon nitride, silicon oxynitride, or silicon carbide nitride.

14. The semiconductor device of claim 10, wherein a first vertical distance between a bottom surface of the first gate spacer and a lowest point of the first contact is greater than a second vertical distance between a bottom surface of the second gate spacer and a lowest point of the second contact.

15. The semiconductor device of claim 10, wherein the first source/drain includes silicon or silicon-carbon, and the second source/drain includes silicon germanium.

16. The semiconductor device of claim 10, wherein the protective dielectric layer is directly above the first and second source/drains.

17. A semiconductor device, comprising:

a first region including:

a first n-type semiconductor layer in a source/drain (S/D) region of the first region;

a second n-type semiconductor layer in another S/D region of the first region; and a first gate stack between and adjacent to both the first and the second n-type semiconductor layers;

a second region including:

a first p-type semiconductor layer in an S/D region of the second region;

a second p-type semiconductor layer in another S/D region of the second region; and a second gate stack between and adjacent to both the first and the second p-type semiconductor layers, wherein a lowest point of an upper surface of the first n-type semiconductor layer is below a lowest point of an upper surface of the second n-type semiconductor layer, and a lowest point of an upper surface of the first p-type semiconductor layer is below a lowest point of an upper surface of the second p-type semiconductor layer.

18. The semiconductor device of claim 17, wherein a first vertical distance between the lowest point of the upper surface of the first n-type semiconductor layer and the lowest point of the upper surface of the second n-type semiconductor layer is greater than a second vertical distance between the lowest point of the upper surface of the first p-type semiconductor layer and the lowest point of the upper surface of the second p-type semiconductor layer.

19. The semiconductor device of claim 18, wherein the first vertical distance is greater than the second vertical distance by at least 5 nanometers.

20. The semiconductor device of claim 17, further comprising:

a first contact disposed over the first n-type semiconductor layer;

a dielectric layer over sidewalls of the first contact;

a contact etch stop layer over sidewalls of the dielectric layer; and a gate spacer between the first gate stack and the contact etch stop layer.

* * * * *